(12) United States Patent
Chen

(10) Patent No.: US 7,522,451 B2
(45) Date of Patent: Apr. 21, 2009

(54) HIGH PROGRAM SPEED MLC MEMORY

(75) Inventor: Chung-Kuang Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 237 days.

(21) Appl. No.: 11/586,657

(22) Filed: Oct. 26, 2006

(65) Prior Publication Data

US 2008/0101144 A1    May 1, 2008

(51) Int. Cl.
*G11C 11/34* (2006.01)

(52) U.S. Cl. .............................. 365/185.03; 365/185.22; 365/230.03; 365/185.33

(58) Field of Classification Search ............ 365/185.03, 365/185.22, 230.03, 185.33
See application file for complete search history.

(56) References Cited

U.S. PATENT DOCUMENTS

| 5,754,469 A * | 5/1998 | Hung et al. ............ 365/185.03 |
| 6,714,457 B1 | 3/2004 | Hsu et al. |
| 7,336,516 B2 * | 2/2008 | Tran et al. .................. 365/49.1 |

* cited by examiner

*Primary Examiner*—Son Dinh
*Assistant Examiner*—Nam Nguyen
(74) *Attorney, Agent, or Firm*—Finnegan, Henderson, Farabow, Garrett & Dunner, LLP

(57) ABSTRACT

Methods and apparatus are provided for programming a flash multiple level memory cell (MLC) memory. The method may include loading data into an SRAM. The method may include reading a plurality of multiple-bit words from the data in the SRAM and loading the words into at least one latch buffer of a power control circuit. The method may also include pairing one or more bits from one of the words in the latch buffer with one or more bits from another of the words in the latch buffer and determining which of the bit pairs require programming. Moreover, the method may include programming, in parallel, each memory cell with the determined bit pairs. The method may further include programming each multiple level memory cell by applying a voltage to the drain side of a transistor of the memory cells corresponding to the determined bit pairs.

17 Claims, 6 Drawing Sheets

HIGH PROGRAM SPEED MLC MEMORY

TECHNICAL FIELD

The present invention generally relates to semiconductor flash memory. More particularly, the present invention relates to programming flash multiple level cell (MLC) memory.

BACKGROUND

Flash memory is commonly used in electronic products. A memory cell in a flash memory array generally contains a control gate, a drain diffusion region, and a source diffusion region on a substrate to form a transistor. The transistor has a floating gate, under the control gate, which forms an electron storage device. A channel region lies under the floating gate, with an insulation layer in the form of a tunnel oxide layer between the channel and floating gate. The energy barrier of the tunnel oxide can be overcome by applying a sufficiently high electric field across the tunnel oxide. This allows electrons to pass through the tunnel oxide, thus changing the number of electrons stored in the floating gate. The number of electrons stored in the floating gate determines the threshold voltage (Vt) of the cell, which represents the stored data of the cell. More electrons stored in the floating gate causes the cell to have a higher Vt. represent the stored data of the cell.

To change the Vt of a cell to a higher or lower value, the number of the electrons stored in the floating gate is increased or decreased by applying proper voltages to nodes which include the control gate, the drain and source regions, and the channel region. This causes electrons to move between one or more of these nodes and through the tunnel oxide layer to the floating gate. Movement of electrons between the channel region and the floating gate is referred to as a "channel operation." Movement of electrons between the drain or source region and the floating gate is referred as an "edge operation," since it takes place on an overlap region between the edge of the floating gate and the drain or source region.

Because the MLC enables the storage of multiple data bits per cell, it has become one of the best candidates in mass storage applications that typically require high density such as 512 Mb and beyond. In a typical four-level MLC, the Vt of the cell is divided into four levels to represent data "00", "01", "10", and "11". Each of the four levels may be programmed serially (i.e., each level is written into the flash memory after the previous level is finished). Therefore, if one cell has four levels, the memory may be programmed three times. Prior to programming, a flash memory array is erased, such that every cell in the array is reset to a default state (e.g., "11"). That is, data may be written into the flash memory in three steps: "00", "01", and "10". "11" is not written because it is the default state after the memory is erased.

FIG. 1 illustrates the serial programming of a four-level memory cell. First, the data to be written may be loaded into a static random access memory ("SRAM") 101 (e.g., page by page). Each page may comprise a number of multiple-bit words. SRAM 101 may include multiple rows and may include two multiple-bit words 102 and 103 in each row. Once the data is loaded, the two multiple-bit words 102 and 103 may be read from each row.

Once the two multiple-bit words 102 and 103 are read, the program may identify a level to be written (e.g., "01"). First, the corresponding bits of words 102 and 103 may be paired. When the bits are paired, the bits from word 103 ("10 . . . 0110") represent the Most Significant Bit (MSB), and the bits from word 102 ("10 . . . 1001") represent the Least Significant BIT (LSB). After pairing the bits, the program may determine which bit-pairs have the value "01." The program may output an indicator value to an output vector 104, which indicates the bits-pairs that may be programmed. The program may output "0" to output vector 104 for each bit-pair that has the value "01," indicating that programming is needed. Conversely, the program may output "1" to output vector 104 for each bit-pair that does not have the value "01" (e.g. "00", "10", "11), indicating that programming is not needed at this time. Output vector 104 may store the indicator values for each bit-pair. For example, output vector 104 stores "11 . . . 0110", indicating that the two bits represented by "0" may be programmed.

Once output vector 104 is created, output vector 104 may be driven onto a data bus 105, stored in a latch 106, and used to program a flash memory array 107 according to latch 106. Output vector 104 may also be written into a VSRAM 108 in the beginning of the page program. After output vector 104 is stored in the latch 106, the bit-pairs corresponding to "01" may be written into the corresponding MLCs of flash memory array 107. This step is referred to as a "shot". SRAM 101 may create the program vector and the first shot program and VSRAM 108 may control subsequent program shots. If the MLC is successfully programmed, the indicator values in VSRAM 108 that were "0" may be changed to "1", which indicates that the data was successfully written.

Once all page data has been written, the program may verify that the data is correctly written. First, the program may read the page data from a flash memory 107. Then, the program may compare this data with the data that should have been written (e.g., "01" from SRAM 101). This is accomplished by comparing the programmed data with the data that is latched into VSRAM 108. If all bits in VSRAM 108 are "1", the page data is successfully written, and the program may exit the loop and continue at another level (e.g. "00", "10"). If any indicators in VSRAM 108 are not "1", the bits associated with the indicators may be written again into the corresponding MLCs of flash memory array 107. This step of again writing the bit-pairs into the MLCs is referred to as "another shot." Once those bits are written, the program may compare the read data again with the data that should have been written. This process may continue until all bits have been written and all indicators in VSRAM 108 are "1".

This process of writing and verifying data results in decreased programming speed. As such, there is a need to increase the programming speed.

SUMMARY

Methods and apparatus consistent with the present invention provide for programming a MLC in parallel. When the MLC is programmed in parallel, each of the four levels of the cell may be programmed at the same time.

In one exemplary embodiment, there is provided a method for parallel programming a flash multiple level memory cell (MLC) memory. The method may include loading data into an SRAM. The method may include reading a plurality of multiple-bit words from the data in the SRAM and loading the words into at least one latch buffer of a power control circuit. The method may also include pairing one or more bits from one of the words in the latch buffer with one or more bits from another of the words in the latch buffer and determining which of the bit pairs require programming. Moreover, the method may include programming, in parallel, each memory cell with the determined bit pairs. The method may further include programming each multiple level memory cell by applying a voltage to the drain side of a transistor of the memory cells corresponding to the determined bit pairs.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, show certain aspects of the present invention and, together with the description, help explain some of the principles associated with the invention. In the drawings.

DETAILED DESCRIPTION

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Figure 1:
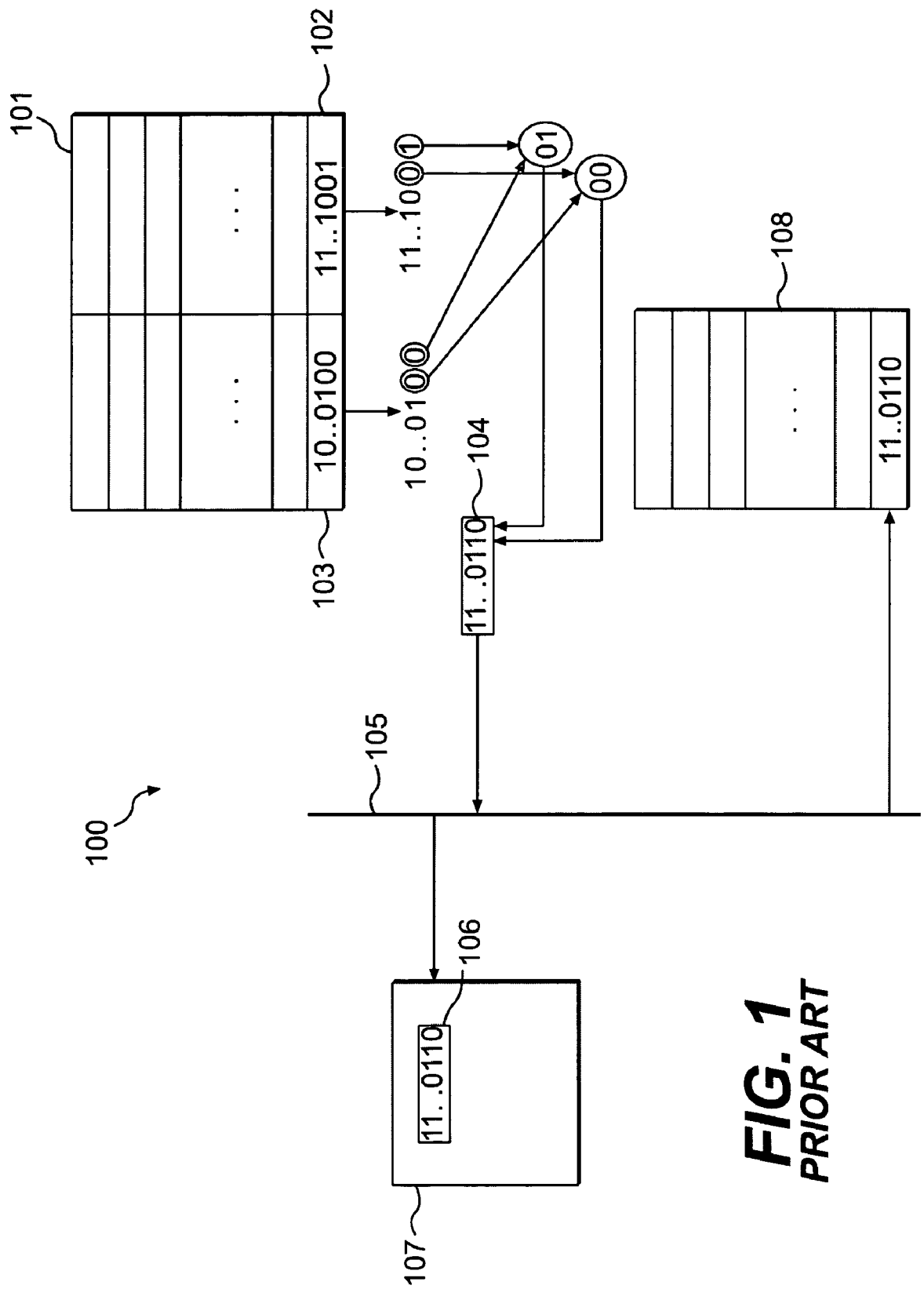
FIG. 1 illustrates a process of programming an MLC according to the prior art.
Figure 2:
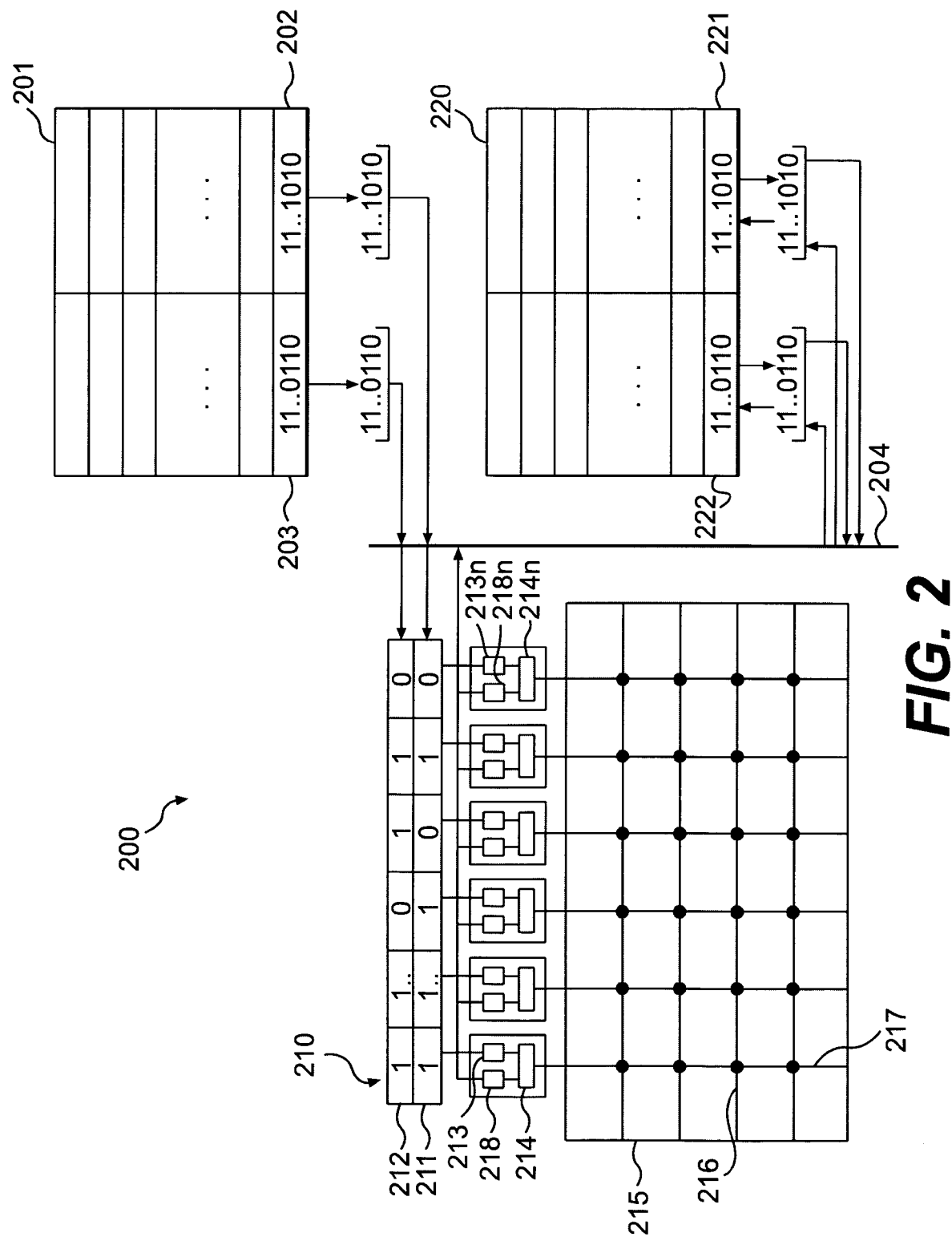
FIG. 2 illustrates an exemplary process of programming an MLC consistent with the present invention.

FIG. 2 illustrates a system 200 for parallel programming of a four-level memory cell. Prior to the programming, the MLCs may be erased, such that every cell is reset to a default state (e.g., "11"). Once the MLCs are erased, the data to be written may be loaded into an SRAM 201 (e.g., page by page). Each page may comprise a number of multiple-bit words. SRAM 201 may include multiple rows and may include two multiple-bit words 202 and 203 in each row. Once the data is loaded, the bits from words 202 and 203 may be read, and corresponding bits may be paired. The bits from word 203 ("10 . . . 0100") corresponds to MSB of the two bits, and the bits from word 202 ("10 . . . 1001") corresponds to the LSB of the two bits.

When the bits from multiple-bit word 202 are read, they may be driven onto data bus 204 and may be written into latch buffer 211 of the flash memory 210. They may also be written into VSRAM 220 in the right side 221 of the first row. Similarly, when the bits from multiple-bit word 203 are read, they may also be driven onto data bus 204 and may be written into a latch buffer 212 of a flash memory 210. They may also be written into VSRAM 220 in the left side 222 of the first row.

Once the bits from multiple-bit words 202 and 203 are written into buffers 211 and 212, respectively, the MLCs in memory array 215 may be programmed. Each MLC in memory array 215 may be coupled to a word line 216 and a bit line 217. The bits in latch buffers 211 and 212 are paired, and all "00", "01", and "10" pairs may be written into the MLCs in memory array 215. "11" is not written because it is the default state after the memory is erased.

Bit pairs "00", "10", and "01", corresponding to the bits of each multiple-bit word 202 and 203 in latch buffer 211 and 212, may be written to the corresponding MLC in the memory cell array 215 at the same time. Each bit pair that needs to be programmed may be sent to ps_vppd circuits 213-213n. Ps_vppd circuits 213-213n may receive the corresponding bit pair and may output a voltage based on the received bit pair. This voltage may be fed through multiplexers 214-214n and may be output into the corresponding MLC in memory cell array 215 to program that cell. This voltage may be applied to the drain side of the transistor for each MLC. Once the MLC is programmed, it may store the bit pair (e.g., "00", "01", "10") that corresponds to the voltage applied to the memory cell.

Figure 3:
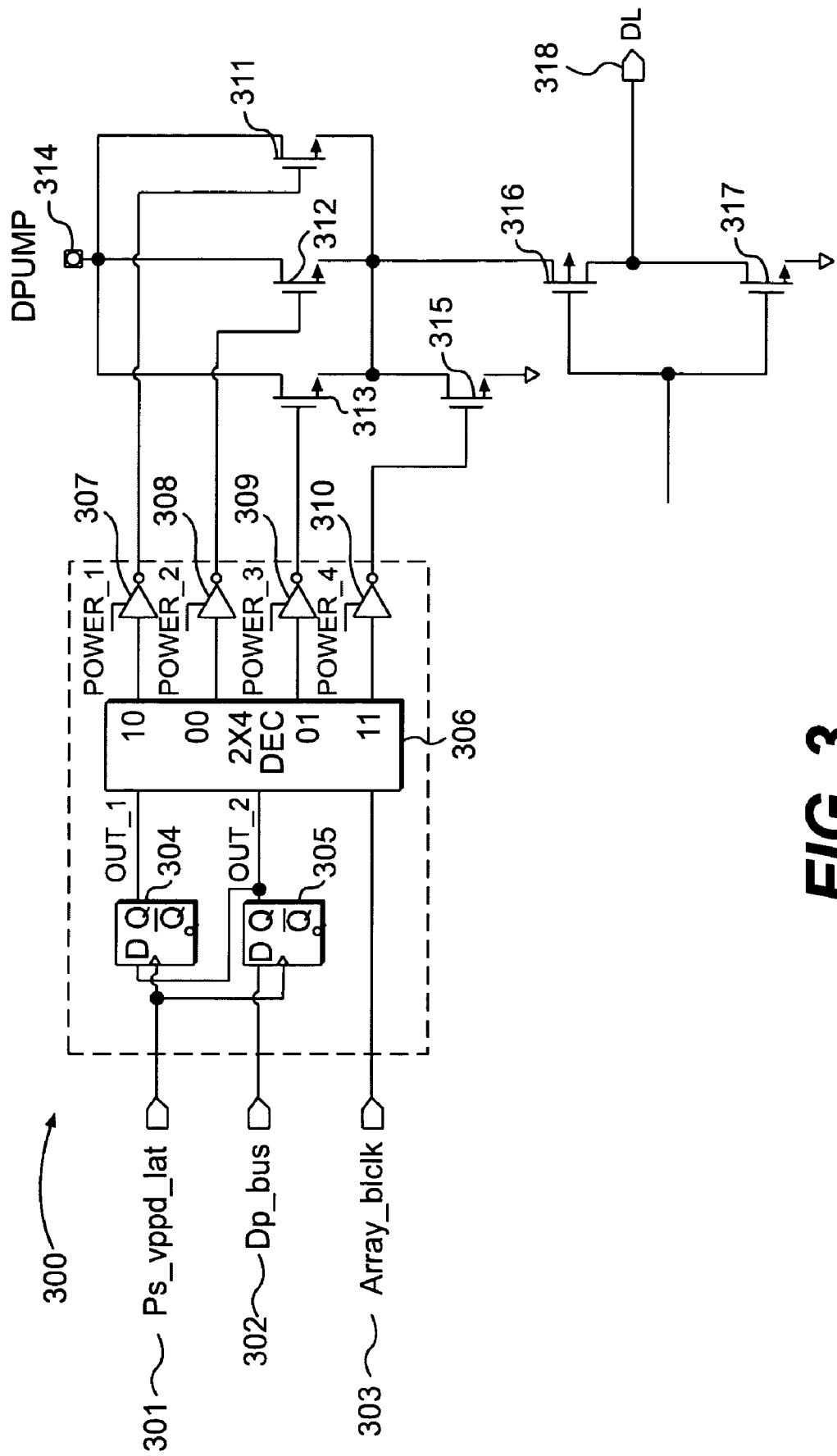
FIG. 3 illustrates a circuit for programming an MLC consistent with the present invention.

FIG. 3 depicts a ps_vppd circuit 300 for producing and applying a voltage on the drain side of the transistor for each MLC in memory cell array 215. Data bus 302 may provide two bits from latch buffers 211 and 212 that are input into flip-flops 304 and 305 in serial. For example, if the two bits that need programming are "01", bit "1" may be sent from data bus 302 to flip-flops 304 and 305. A latch 301 may send a trigger signal and may latch the bit into flip-flop 305. Flip-flop 305 may output bit "1", and bit "1" may be input into flip-flop 304 and may be latched by latch 301. After bit "1" is output from flip-flop 305, bit "0" may be input from data bus 302 and may be latched into flip-flop 305 by latch 301. After both bits are stored in flip-flops 304 and 305, they may be output into a decoder 306 in parallel. Both bits may be input into decoder 306 along with a clock signal 303.

Decoder 306 may output a signal, corresponding to the two bits that are input from flip-flops 304 and 305, to one of four inverters 307, 308, 309, and 310. Inverters 307, 308, 309, and 310 are driven by power voltages Power_1, Power_2, Power_3, and Power_4. In one aspect, power voltages Power_1, Power_2, and Power_3 are different from one another so that inverters 307, 308, and 309 output different voltages corresponding to power voltages Power_1, Power_2, and Power_3 when the corresponding output from decoder 306 is selected.

NMOS transistors 311, 312, 313, and 315 may be connected to inverters 307, 308, 309, and 310, respectively, and may be connected to a DPUMP 314, which is pumped to a high voltage level. Transistors 311, 312, and 313 may form source followers for passing the voltage output from the corresponding one of inverters 307, 308, and 309 onto a DL 318, which connects to the drain side of the flash cell in memory array 215. Transistors 316 and 317 may act as a driver circuit to allow the voltage from the appropriate transistor 311, 312, and 313 to be applied to DL 318. When the output of decoder 306 is "11," inverter 310 outputs a power voltage corresponding to Power_4, turning on transistor 315. As a result, the driver circuit is disabled and no voltage is applied on DL 318.

For example, if the two bits are "01", decoder 306 may output a signal "0" to inverter 309, which corresponds to "01". Decoder 306 will output a signal "1" to inverters 307, 308, or 310. The voltage from inverter 309 may be fed into transistor 313, and transistor 313 may pass a voltage from DPUMP 314, corresponding to the voltage from inverter 309, onto DL 318. Transistors 311, 312, and 315 may be grounded at this time. DL 318 may apply this voltage to the drain side of the transistor for the appropriate MLC in memory cell array 215. Once this MLC flash cell is programmed, it may store the bit pair "01".

Referring back to FIG. 2, once the data has been written, the program may verify that the data is correctly written. SENAMPs (sense amplifiers) 218-218n may read two bits from each MLC in the memory cell array 215 and may output the two bits onto the data bus 204 in two cycles. The two bits may be compared against the corresponding two bits in VSRAM 220. For each MLC, if the programming was successful, the program may change the corresponding two bits in the VSRAM 220 to "11". After every two-bit is changed to "11", the program is finished.

If every two-bit in VSRAM 220 is not "11", the bits may be written into the MLC again. Once those bits are written, SENAMPs 218-218n may compare the two bits against the corresponding two bits in VSRAM 220 again. This process continues until all bits have been written and every two-bit in VSRAM 220 is "11".

This program verification may be looped until the whole row of MLCs have been successfully programmed. Once the first row of MLCs is successfully programmed, the second row of MLCs may be programmed. The second row may be programmed and verified in the same manner. Alternatively, the programming may be looped until the whole page has been read and one shot has been performed for each word to be written. Once this is completed, the verify process may also be looped for all rows.

Unlike the prior art, VSRAM 220 may receive the actual bits from the SRAM 201, not indicator values. Because the actual bits are stored in VSRAM 220, SRAM 201 does not have to be accessed for each shot after the first shot. Rather, for the subsequent shots, the data may come directly from VSRAM 220.

VSRAM 220 may also be used if the user or application wishes to retain the data in SRAM 201. If the user or application does not require retention of data in SRAM 201, VSRAM 220 does not need to be used. In this case, when the program verifies that the data is correctly written, SENAMPs 218-218n may read two bits from each MLC in memory cell array 215 and may output the two bits onto data bus 204 in two cycles. The two bits may be compared against the corresponding two bits in SRAM 201. For each MLC, if the programming was successful, the program may change the corresponding two bits in the SRAM 201 to "11". After every two-bit is changed to "11", the program is finished.

If every two-bit in SRAM 201 is not "11", the bits may be written into the MLC again. Once those bits are written, SENAMPs 218-281n may compare the two bits against the corresponding two bits in SRAM 201 again. This process continues until all bits have been written and every two-bit in SRAM 201 is "11".

This program verification using SRAM 201 may also be looped until the whole page of MLCs have been successfully programmed. The programming may be looped until the whole page has been read and one shot has been performed for each word to be written. Once this is completed, the verify process can also be looped for all rows.

Figure 4:
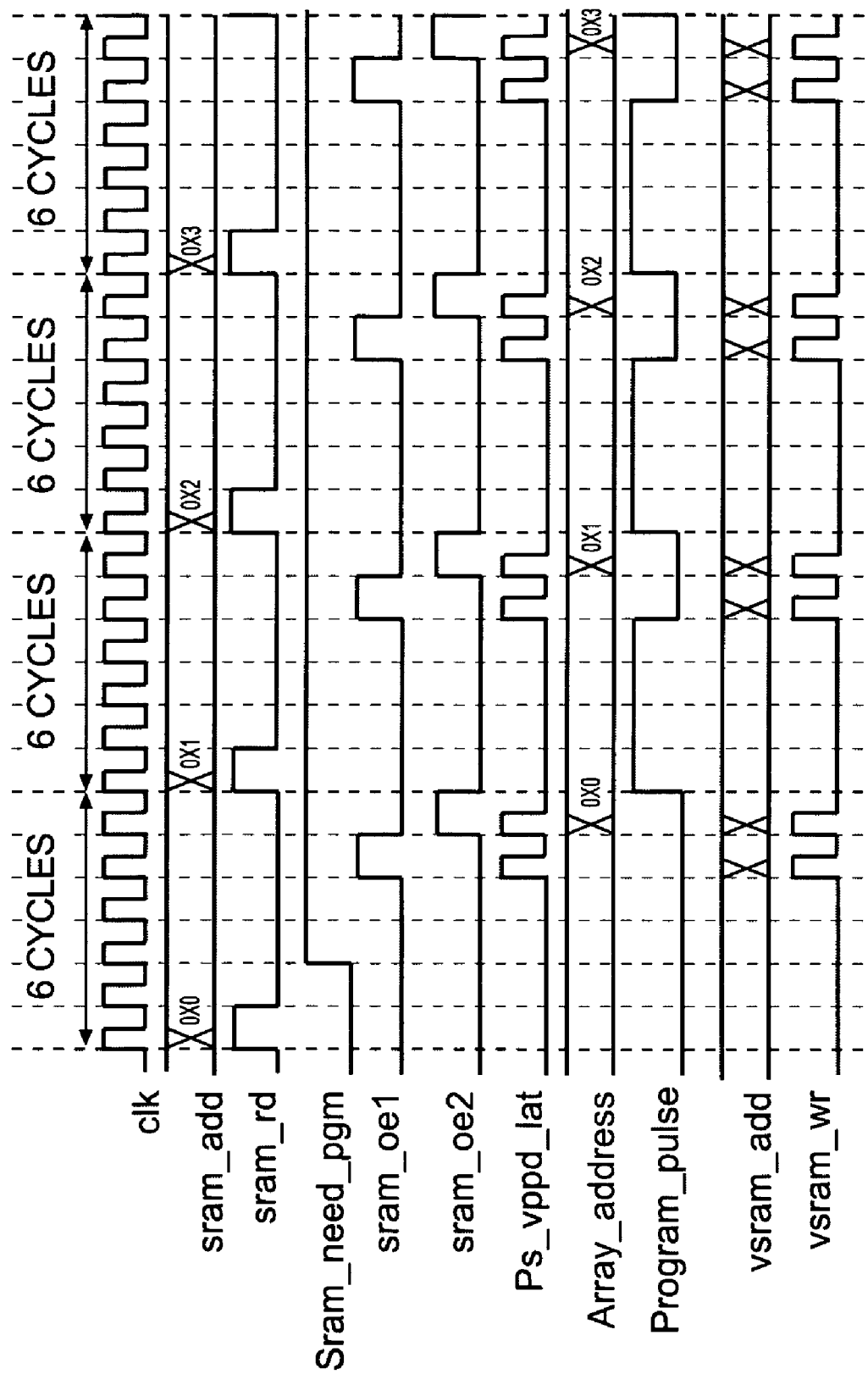
FIG. 4 is an exemplary timing chart for writing data in a first program shot, consistent with the present invention.

FIG. 4 is an exemplary timing chart for writing data in a first program shot from SRAM 201 into MLCs of the memory array 215. Sram_add refers to the address of SRAM 201, and sram_rd may trigger the program to read two multiple-bit words 202 and 203 from SRAM 201. Sram_need_pgm may determine if the two multiple-bit words from SRAM 201 need to be written. If the two multiple-bit words 202 and 203 from SRAM 201 need to be programmed, sram_oe1 and sram_oe2 may read the bits from multiple-bit words 202 and 203 in SRAM 201. Ps_vppd_lat may trigger flip-flops 304 and 305 to latch the data from data bus 204. Array_address refers to the location of the MLC in memory array 215. Program_pulse is a program control pulse that may generate a signal to program the selected MLC in memory array 215 with the corresponding data. When program_pulse is "1", the program is enabled. Vsram_add refers to the address of VSRAM 220, and vsram_wr may trigger the program to write the multiple-bit words 202 and 203 into VSRAM 220.

Figure 5:
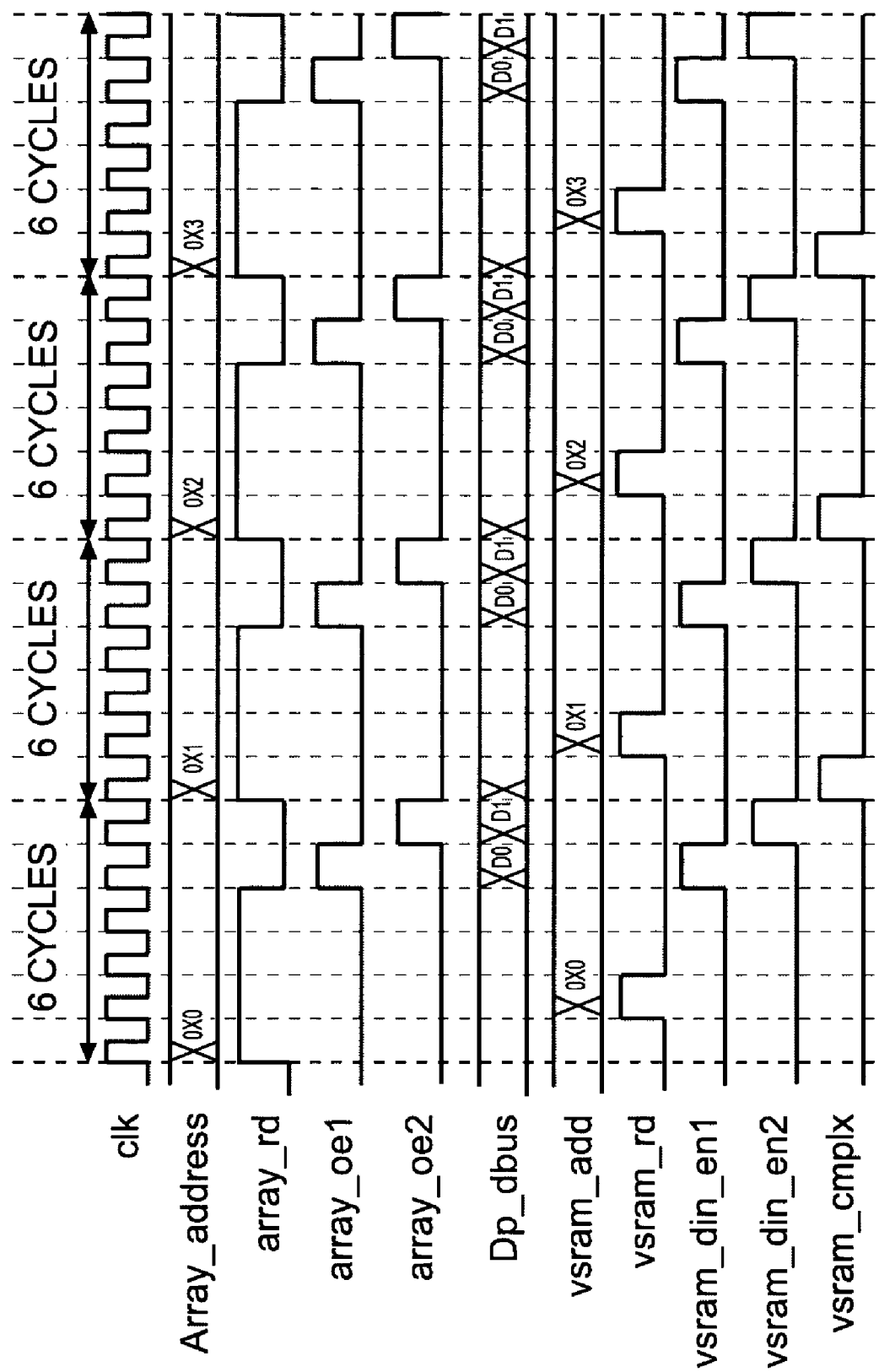
FIG. 5 is an exemplary timing chart for verifying the written data, consistent with the present invention.

FIG. 5 is an exemplary timing chart for verifying the written data. Array_address refers to the location of the data in the MLC in memory array 215. Array_rd may trigger the program to read the data from the MLC in memory array 215. Array_oe1 may read the first bit and array_oe2 may read the second bit. Dp_dbus may latch the bits onto data bus 204. Vsram_add refers to the address of VSRAM 220, and vsram_rd may read the two multiple-bit words 221 and 222 from VSRAM 220. Vsram_din_en1 and vsram_din_en2 may read the first and second bits from multiple-bit words 221 and 222 in VSRAM 220. If these bits are programmed successfully, vsram_cmpix may complete the verification and update the bits in VSRAM 220 by changing them to "11".

Figure 6:
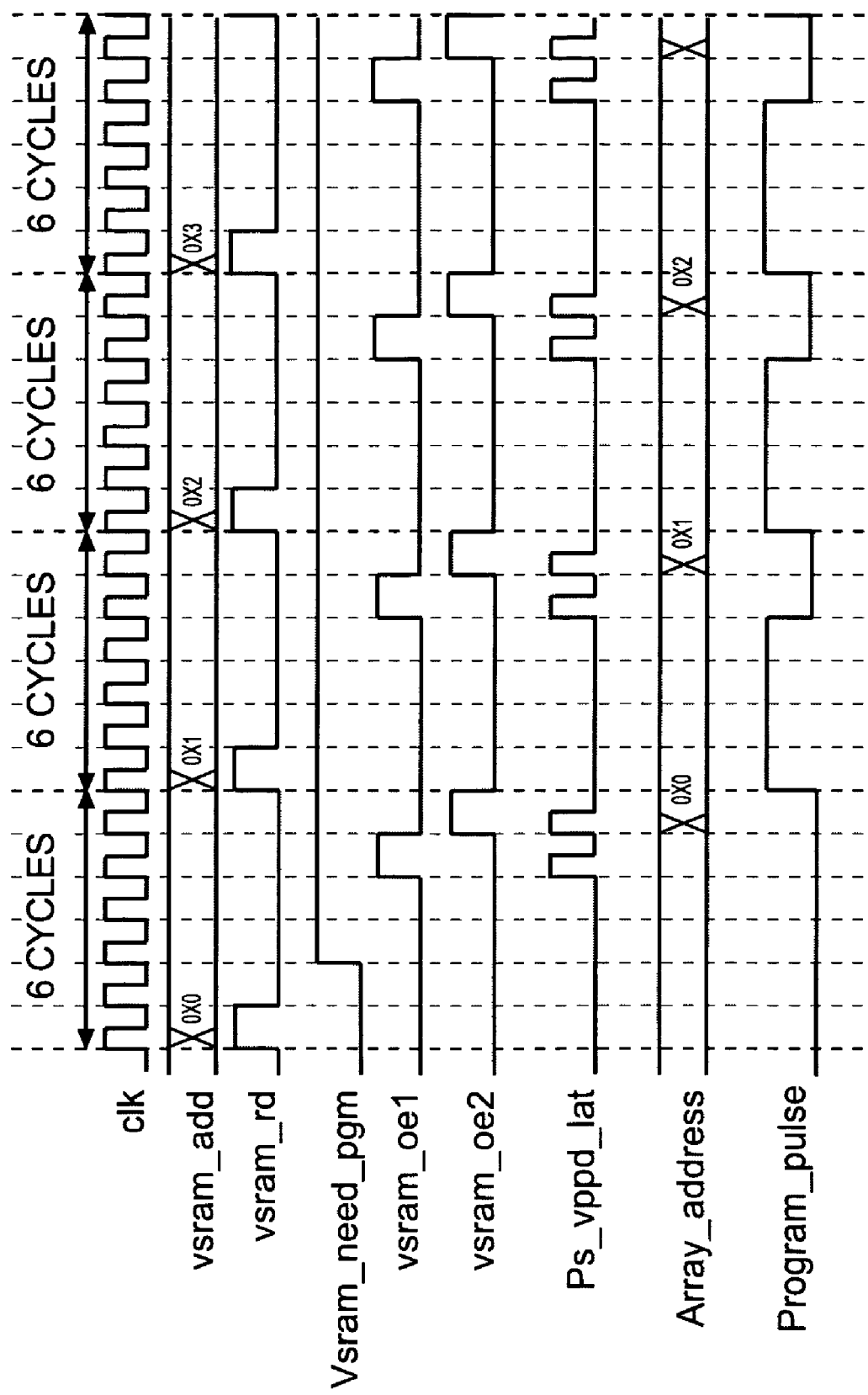
FIG. 6 is an exemplary timing chart for writing data in program shots after the first shot, consistent with the present invention.

FIG. 6 is an exemplary timing chart for writing data in program shots after the first shot. If every bit-pair in VSRAM 220 is not "11", the bits may written into the MLC in memory array 215 again in another shot. Vsram_add refers to the address of VSRAM 220. Vsram_rd may read the bits in VSRAM 220 and signal Vsram_need_pgm may determine if the bits in VSRAM 220 need to be programmed again. If the bits need to be programmed again, vsram_oe1 and vsram_oe2 may read the bits from VSRAM 220 and Ps_vppd_lat may latch the bits onto data bus 204. The bits that need to be programmed again may be stored in buffers 211 and 212. Array_address refers to the location of the MLC in memory array 215 where the bits may be programmed and program_pulse may generate a signal to program the bits into MLC in memory array 215. This process continues until all bits have been written and every bit-pair in VSRAM 220 is "11".

The foregoing description is intended to illustrate but not to limit the scope of the invention, which is defined by the scope of the appended claims. Other embodiments are within the scope of the following claims.

What is claimed is:

1. A method for parallel programming a multiple-level cell (MLC) memory, the method comprising:
   loading data into an SRAM;
   reading a plurality of multiple-bit words from the data in the SRAM;
   loading the words into at least one latch buffer;
   pairing one or more bits from one of the words in the at least one latch buffer with one ore bits from another of the words in the at least one latch buffer;
   determining which of the bit pairs require programming;
   programming, in parallel, the memory cells with the determined bit pairs;
   selecting one of a plurality of voltages; and
   applying the selected voltage through one of a plurality of source followers to a drain side of one of the memory cells corresponding to the determined bit pairs.

2. The method of claim 1, wherein applying the selected voltage comprises,
   applying the selected voltage through one of the plurality of source followers and a driver circuit.

3. The method of claim 1, further comprising:
   loading the words into a VSRAM.

4. The method of claim 3, further comprising:
   comparing the programmed bit pairs with the corresponding bit pairs of the words in the VSRAM.

5. The method of claim 4, further comprising:
determining if the bit pairs were successfully programmed; and
changing all successfully programmed bit pairs in the VSRAM to an indicator value that indicates that the bit pairs were successfully programmed.

6. The method of claim 4, further comprising:
determining if any bit pairs were not successfully programmed; and
programming again, in parallel, the memory cells with the bit pairs that were not successfully programmed.

7. The method of claim 1, further comprising:
comparing the programmed bit pairs with the corresponding bit pairs of the data the SRAM.

8. The method of claim 7, further comprising:
determining if the bit pairs were successfully programmed; and
changing all successfully programmed bit pairs of the data in the SRAM to an indicator value that indicates that the bit pairs were successfully programmed.

9. The method of claim 1, further comprising:
determining if any bit pairs were not successfully programmed; and
programming again, in parallel, the memory cells with the bit pairs that were not successfully programmed.

10. Apparatus for parallel programming a multiple-level cell (MLC) memory, the apparatus comprising:
an SRAM for receiving data;
at least one latch buffer for receiving a plurality of multiple-bit words read from the SRAM; and
a plurality of multiple-level memory cells for receiving bit pairs that are formed by pairing one or more bits from one of the words in the at least one latch buffer with one or more bits from another of the words in the at least one latch buffer;
wherein:
the memory cells are programmed, in parallel, with the bit pairs that require programming, and
a drain side of one of the memory cells corresponding to the determined bit pairs receives a voltage through one of a plurality of source followers.

11. The apparatus of claim 10, further comprising:
a VSRAM for receiving the words.

12. The apparatus of claim 11, further comprising:
verification means for comparing the programmed bit pairs with the corresponding bit pairs of words in the VSRAM.

13. The apparatus of claim 12, wherein the verification means:
determines if the bit pairs were successfully programmed and changes all successfully programmed bit pairs in the VSRAM to an indicator value that indicates that the bit pairs were successfully programmed.

14. The apparatus of claim 13, wherein:
the memory cells are programmed again, in parallel, with the bit pairs that were not successfully programmed.

15. The apparatus of claim 10, further comprising:
verification means for comparing the programmed bit pairs with the corresponding bit pairs in the SRAM.

16. The apparatus of claim 15, wherein the verification means:
determines if the bit pairs were successfully programmed and changes all successfully programmed bit pairs of words in the SRAM to an indicator value that indicates that the bit pairs were successfully programmed.

17. The apparatus of claim 16, wherein:
the memory cells are programmed again, in parallel, with the bit pairs that were not successfully programmed.

* * * * *